US007336550B2

(12) United States Patent
Lee

(10) Patent No.: US 7,336,550 B2
(45) Date of Patent: Feb. 26, 2008

(54) SEMICONDUCTOR MEMORY DEVICE WITH REDUCED MULTI-ROW ADDRESS TESTING

(75) Inventor: Hi-choon Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/486,184

(22) Filed: Jul. 13, 2006

(65) Prior Publication Data

US 2007/0014167 A1 Jan. 18, 2007

(30) Foreign Application Priority Data

Jul. 14, 2005 (KR) ............. 10-2005-0063758

(51) Int. Cl.
*G11C 7/00* (2006.01)
*G11C 8/00* (2006.01)
(52) U.S. Cl. ............. 365/200; 365/201; 365/225.7; 365/230.03; 365/230.06
(58) Field of Classification Search ................ 365/200, 365/201, 225.7, 230.06, 230.03
See application file for complete search history.

(56) References Cited

U.S. PATENT DOCUMENTS

| 4,908,798 A | | 3/1990 | Urai ............ 365/230.03 |
| 5,337,277 A | * | 8/1994 | Jang ............. 365/200 |
| 5,349,556 A | * | 9/1994 | Lee ............. 365/200 |
| 5,355,339 A | * | 10/1994 | Oh et al. ........ 365/200 |
| 5,359,560 A | * | 10/1994 | Suh et al. ....... 365/200 |
| 5,469,388 A | * | 11/1995 | Park ............ 365/200 |
| 5,970,002 A | * | 10/1999 | Yoo ............. 365/200 |
| 6,094,382 A | * | 7/2000 | Choi et al. ...... 365/200 |
| 6,154,389 A | * | 11/2000 | Chung et al. .... 365/200 |
| 6,388,925 B1 | * | 5/2002 | Kim ............ 365/200 |
| 6,411,556 B1 | * | 6/2002 | Amano .......... 365/200 |
| 6,504,769 B2 | * | 1/2003 | Do et al. ....... 365/200 |
| 6,552,939 B1 | * | 4/2003 | Miki et al. ..... 365/200 |
| 6,577,545 B2 | | 6/2003 | Kim et al. |
| 6,657,915 B2 | * | 12/2003 | Seo et al. ...... 365/201 |
| 7,068,553 B2 | * | 6/2006 | Lee ............ 365/200 |
| 7,111,193 B1 | * | 9/2006 | Hsieh et al. .... 365/200 |
| 2002/0006067 A1 | | 1/2002 | Kim et al. |

FOREIGN PATENT DOCUMENTS

| JP | 2004-342220 | 12/2004 |
| KR | 2002-0006091 | 1/2002 |
| KR | 10-0338776 | 5/2002 |
| KR | 10-0450114 | 9/2004 |

* cited by examiner

*Primary Examiner*—Trong Phan
(74) *Attorney, Agent, or Firm*—Mills & Onello LLP

(57) ABSTRACT

A semiconductor memory device and multi-row address test method reduce the time it takes to perform the multi-row address test. The semiconductor memory device comprises normal memory cell blocks, which can include normal memory cells and spare cells that replace defective cells. The device also includes a redundancy signal generator to output a redundancy signal indicating whether any memory cell blocks include defective cells and address signals of repair word lines corresponding to the defective cells. A redundancy signal decoder decodes the redundancy signal and the address signals of the repair word lines and outputs word line enable signals, and word line drivers that do not enable the repair word lines, but selectively enable the normal word lines in response to the word line enable signals.

16 Claims, 3 Drawing Sheets

SEMICONDUCTOR MEMORY DEVICE WITH REDUCED MULTI-ROW ADDRESS TESTING

CROSS-REFERENCE TO RELATED PATENT APPLICATIONS

This application claims the benefit of Korean Patent Application No. 10-2005-0063758, filed on Jul. 14, 2005, in the Korean Intellectual Property Office, the contents of which are incorporated herein in their entirety by reference.

BACKGROUND OF THE INVENTION

1. Field of the Invention

The present invention relates to a semiconductor memory device, and more particularly, to a semiconductor memory device and multi-row address test method that reduces the time it takes to perform the multi-row address test.

2. Description of the Related Art

Demand for mass storage semiconductor memory devices has rapidly increased. As the storage capacity of semiconductor memory devices increases, time for testing semiconductor memory devices also increases. Since test times are related to productivity of semiconductor memory devices, an attempt to reduce test time is continuously being made. Testing to determine whether or not semiconductor memory cells are defective occupies the greatest percentage of time taken to test semiconductor memory devices.

A multi-row address test method is generally used to reduce the time it takes to test whether memory cells are defective by simultaneously enabling a plurality of word lines. The multi-row address test method is more effective to reduce the time it takes to test whether memory cells are defective than that of a test method where word lines are enabled one-by-one.

To increase memory cell yield, a conventional semiconductor memory devices include spare memory cells. When the conventional semiconductor memory devices have defective memory cells, the defective memory cells are generally avoided in favor of spare cells that are also included in the conventional semiconductor memory devices.

In conventional semiconductor memory devices, when defective cells are replaced with spare cells, the multi-row address test method must not enable normal word lines corresponding to those defective cells, each referred to as a repair word line (RWL). In such cases, it would be advantageous for normal word lines, excluding the repair word lines, to be selectively enabled. However, the semiconductor memory device cannot selectively enable or disable word lines. Therefore, it is difficult and time consuming to perform the multi-row address test method when memory cells are defective.

SUMMARY OF THE INVENTION

The present invention provides a semiconductor memory device that selectively enables normal word lines excluding a word line of a defective cell, thereby reducing the time it takes to perform a multi-row address test.

The present invention also provides a multi-row address test method that selectively enables normal word lines excluding a word line of a defective cell, thereby reducing the time it takes to perform a multi-row address test.

According to an aspect of the present disclosure, provided is a semiconductor memory device comprising a plurality of memory cell blocks, each comprising a plurality of memory cells and a set of word lines configured to access cells from the plurality of memory cells. The semiconductor memory device can comprise a redundancy signal generator configured to output a redundancy signal indicating whether any of the plurality of memory cell blocks includes one or more defective cells and, if there are one or more defective cells in at least one cell block, configured to output address signals of repair word lines corresponding to the one or more defective cells. A redundancy signal decoder is configured to decode the redundancy signal and the address signals of the repair word lines and based thereon to output word line enable signals associated with normal word lines that do not relate to the one or more defective cells. Also provided is a set of normal word line drivers configured to selectively enable the normal word lines and not to enable the repair word lines in response to the word line enable signals.

The redundancy signal generator can comprise a plurality of fuse boxes, each fuse box including a plurality of fuses selectively disconnected based on information about addresses of the one or more defective cells, wherein the plurality of fuse boxes output the address signals of the repair word lines in response to information about locations of the disconnected fuses. The plurality of fuse boxes can be further configured to output fuse box redundancy signals indicating which of the memory cell blocks includes at least one defective cell from the one or more defective cells, wherein the redundancy signal generator can also comprise a fuse box redundancy signal arithmetic operator configured to output the redundancy signal based on to the fuse box redundancy signals. The fuse box redundancy signal arithmetic operator can be a NOR gate that performs a NOR operation on the fuse box redundancy signals.

The redundancy signal decoder can comprise a plurality of decoders corresponding to the plurality of memory cell blocks, wherein each decoder in the plurality of decoders can be configured to decode the redundancy signal and the address signals of the repair word lines associated with a corresponding memory cell block from the plurality of memory cell blocks. The redundancy signal decoder can also be configured to output the word line enable signals in response to a multi-word line test enable signal activated in a multi-word line test mode.

The plurality of memory cells can further include a set of spare memory cells configured to replace defective memory cells, and the set of word line drivers can be configured to enable a word line from the set of word lines as a spare word line associated with at least one spare memory cell from the set of spare memory cells to replace at least one defective cell from the one or more defective cells.

In accordance with another aspect of the disclosure, provided is a multi-row address test method that enables a plurality of word lines of a semiconductor memory device. The semiconductor memory device can comprise a plurality of memory cell blocks, each comprising a plurality of memory cells and a set of word lines configured to access cells from the plurality of memory cells. The method comprises outputting a redundancy signal indicating whether at least one of the memory cell blocks includes one or more defective cells, outputting address signals of repair word lines corresponding to the one or more defective cells, decoding the redundancy signal and the address signals of the repair word lines and outputting word line enable signals corresponding to normal word lines and that do not relate to the one or more defective cells, and selectively enabling the normal word lines in response to the word line enable signals, without enabling the repair word lines.

In the method, outputting the redundancy signal can comprise selectively disconnecting one or more fuses in one or more of a plurality of fuse boxes based on information about addresses of the one or more defective cells, and outputting the address signals of the repair word lines in response to information about locations of the disconnected fuses. The method can also include outputting fuse box redundancy signals by the plurality of fuse boxes indicating which of the memory cell blocks includes at least one defective cell from the one or more defective cells, and outputting the redundancy signal by a fuse box redundancy signal arithmetic operator based on the fuse box redundancy signals. Providing the redundancy signal can include providing a NOR gate as the fuse box redundancy signal arithmetic operator and performing a NOR operation on the fuse box redundancy signals.

In the method, decoding can include providing a plurality of decoders corresponding to the plurality of memory cell blocks, and decoding, with at least one decoder in the plurality of decoders, the redundancy signal and the address signals of the repair word lines associated with a corresponding memory cell block from the plurality of memory cell blocks.

The method can also include outputting the word line enable signals in response to a multi-word line test enable signal activated in a multi-word line test mode. The method can also comprise providing a set of spare memory cells configured to replace defective memory cells, and enabling a word line from the set of word lines as a spare word line associated with at least one spare memory cell from the set of spare memory cells to replace at least one defective cell from the one or more defective cells.

In accordance with another aspect of the present disclosure, provide is a semiconductor memory device comprising a plurality of memory cell blocks each comprising a plurality of memory cells and a set of word lines configured to access cells from the plurality of memory cells. The semiconductor memory device comprises a redundancy signal generator configured to output a redundancy signal indicating whether any of the plurality of memory cell blocks includes one or more defective cells and, if there are one or more defective cells in at least one cell block, configured to output address signals of repair word lines corresponding to the one or more defective cells, wherein the redundancy signal generator comprises a plurality of fuse boxes, each fuse box including a plurality of fuses selectively disconnected based on information about addresses of the one or more defective cells, wherein the plurality of fuse boxes output the address signals of the repair word lines in response to information about locations of the disconnected fuses. The device further comprises a redundancy signal decoder configured to decode the redundancy signal and the address signals of the repair word lines and based thereon to output word line enable signals associated with normal word lines that do not relate to the one or more defective cells. And the device further comprises a set of normal word line drivers configured to selectively enable the normal word lines and not to enable the repair word lines in response to the word line enable signals. In the device, the plurality of memory cells further includes a set of spare memory cells configured to replace defective memory cells, wherein the set of word line drivers is configured to enable a word line from the set of word lines as a spare word line associated with at least one spare memory cell from the set of spare memory cells to replace at least one defective cell from the one or more defective cells.

BRIEF DESCRIPTION OF THE DRAWINGS

The above and other features and advantages of the present invention will become more apparent by describing in detail exemplary embodiments thereof with reference to the attached drawings, in which like reference numerals in the drawings denote like elements, wherein.

DETAILED DESCRIPTION OF PREFFERED EMBODIMENTS OF THE INVENTION

Semiconductor memory devices with efficient multi-row address testing according to the present disclosure will now be described more fully with reference to the accompanying drawings, in which exemplary embodiments are shown. The invention may, however, be embodied in many different forms and should not be construed as being limited to the embodiments set forth herein; rather, these embodiments are provided so that this disclosure will be thorough.

Figure 1:
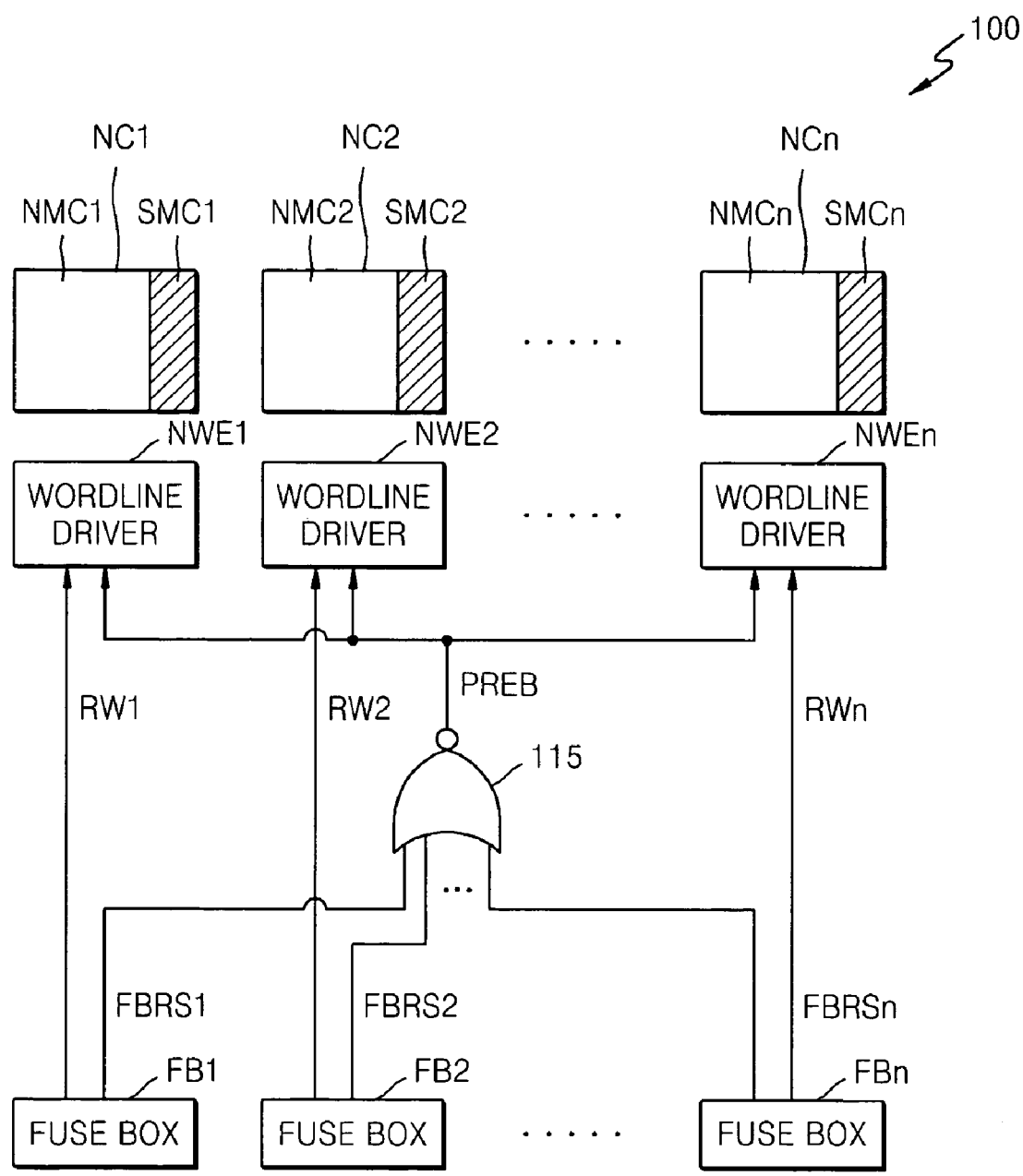
FIG. 1 is a block diagram of a semiconductor memory device.

FIG. 1 is a block diagram of a semiconductor memory device 100. Referring to FIG. 1, the semiconductor memory device 100 comprises memory cell blocks NC1 through NCn. Each memory cell block includes a set of normal memory cells NMC and at least one spare memory cell SMC. In FIG. 1 the set of normal memory cells in memory block NC1 is designated by the reference NMC1 and the at least one spare memory cell in memory block NC1 is designated by the reference SMC1. Memory blocks NC2 through NCn follow the same convention, with sets of normal memory cell blocks NMC2 through NMCn and spare memory cells SMC2 through SMCn. The spare cells SMC1 through SMCn are included as optional substitutes for defective normal memory cells in the normal memory cells NMC1 through NMCn.

The semiconductor memory device 100 further comprises a plurality of fuse boxes FB1 through FBn, a NOR gate 115, and word line drivers NWE1 through NWEn. The plurality of fuse boxes FB1 through FBn comprise a plurality of fuses. If any of the memory cell blocks NC1 through NCn include the defective cells, the fuses corresponding to the defective cells are disconnected. The plurality of fuse boxes FB1 through FBn output fuse box redundancy signals FBRS1 through FBRSn indicating whether there are defective cells in the memory cell blocks NC1 through NCn. For example, FBRS1 indicates whether there is a defective cell in cell block NC1. Address signals RW1, RW2, through RWn output by corresponding fuse boxes FB1, FB2, through FBn indicate repair word lines (RWL) corresponding to defective cells, if any.

The NOR gate 115 outputs a pre-charge signal PREB in response to the fuse box redundancy signals FBRS1 through FBRSn. The word line drivers NWE1 through NWEn enable corresponding word lines of the memory cell blocks NC1 through NCn in response to the pre-charge signal PREB.

Figure 2:
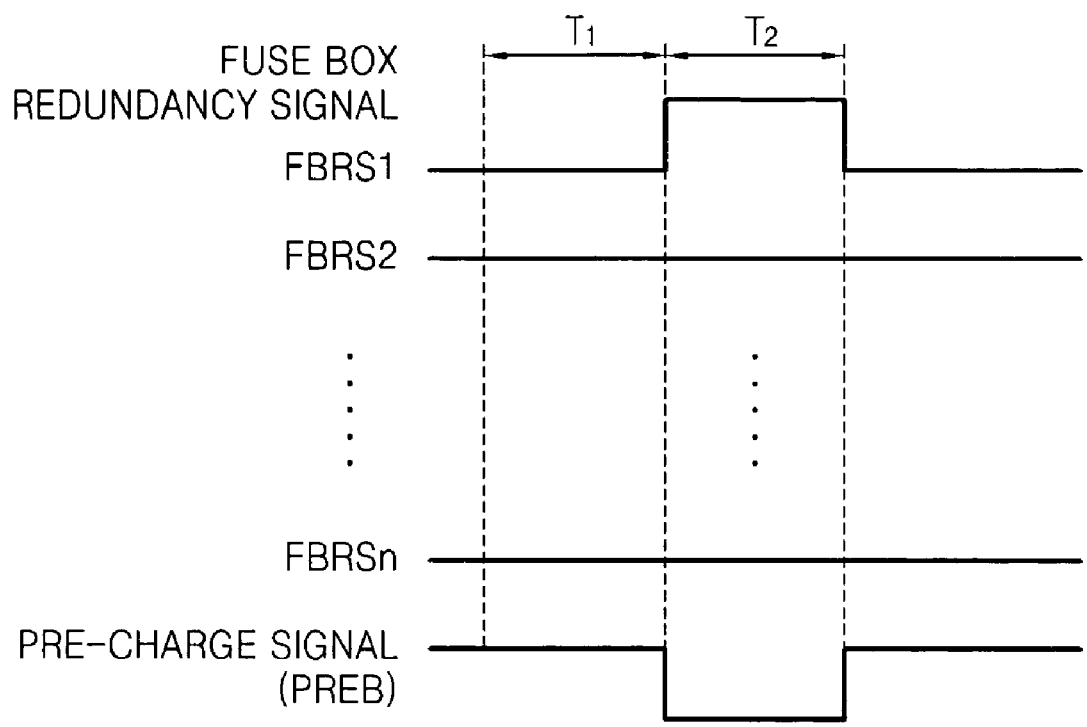
FIG. 2 is a timing diagram of the fuse box redundancy signals and the pre-charge signal for the device illustrated in FIG. 1.

FIG. 2 is a timing diagram of the fuse box redundancy signals FBRS1 through FBRSn and the pre-charge signal PREB illustrated in FIG. 1. Referring to FIGS. 1 and 2, a multi-row address test method performed by the semiconductor memory device 100 will now be described.

When the semiconductor memory device 100 does not include a defective cell (i.e., the T1 section), the plurality of fuse boxes FB1 through FBn output logic low fuse box redundancy signals FBRS1 through FBRSn. The NOR gate 115 performs a NOR-operation of the logic low fuse box redundancy signals FBRS1 through FBRSn, and outputs a logic high pre-charge signal PREB.

When a memory cell corresponding to the first fuse box FB1 is defective (i.e., the T2 section), the first fuse box FB1 outputs logic high fuse box redundancy signals FBRS1. The other fuse boxes FB2 through FBn output logic low fuse box redundancy signals FBRS2 through FBRSn. The NOR gate 115 performs the NOR-operation of the fuse box redundancy signals FBRS1 through FBRSn, and outputs a logic low pre-charge signal PREB. The normal word line drivers NWE1 through NWEn disable all word lines in response to the logic low pre-charge signal PREB.

Figure 3:
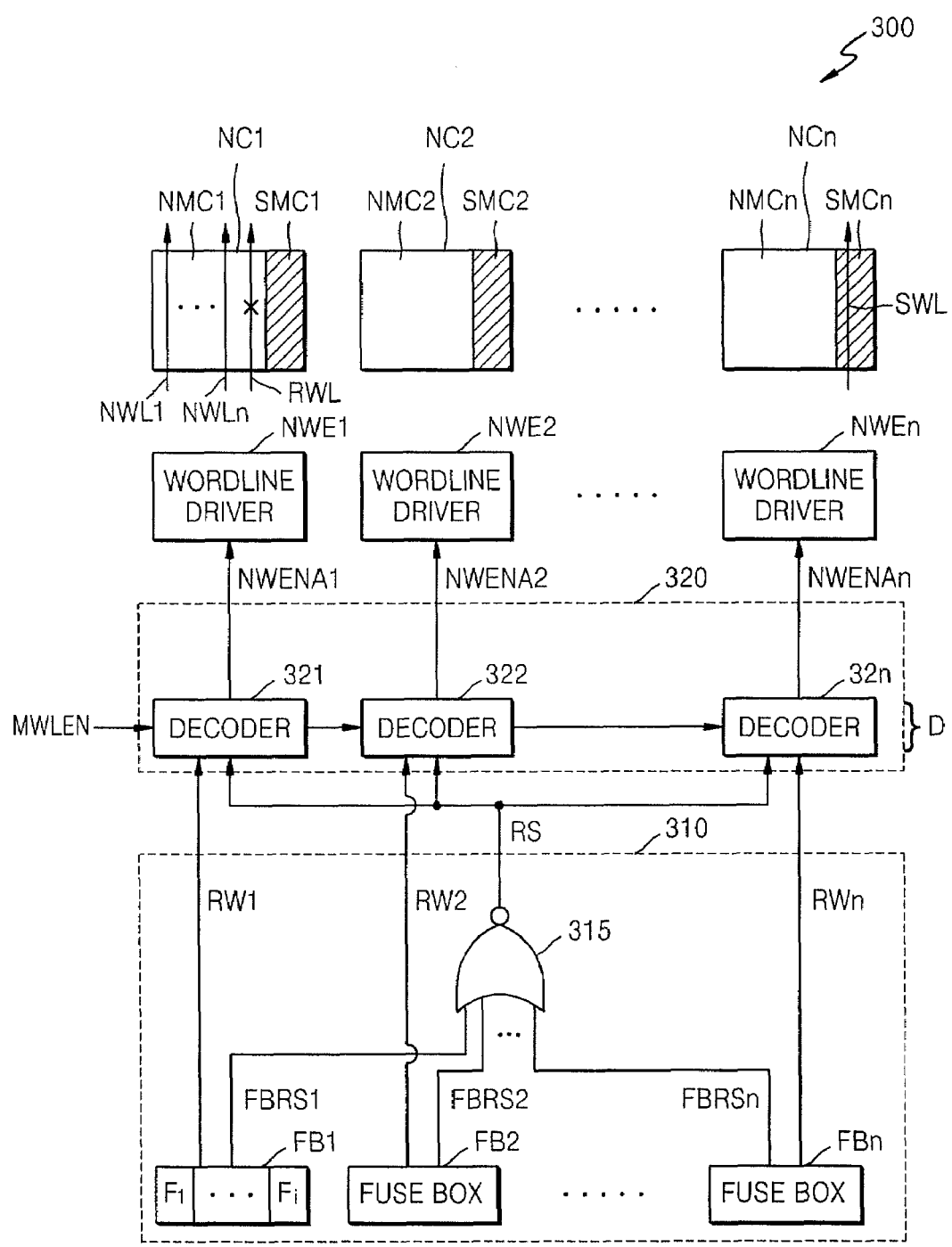
FIG. 3 is a block diagram of a semiconductor memory device that reduces the time it takes to perform a multi-row address test according to an embodiment of the present invention.

FIG. 3 is a block diagram of a semiconductor memory device 300 that reduces the time it takes to perform a multi-row address test according to an embodiment of the present disclosure. Referring to FIG. 3, the semiconductor memory device 300 comprises memory cell blocks NC1 through NCn, a redundancy signal generator 310, a redundancy signal decoder 320, and word line drivers NWE1 through NWEn.

As in FIG. 1, each of the normal memory cell blocks NC1 through NCn comprises a set of normal memory cells and a set of spare memory cells. Generally, the memory cells could be arranged in a matrix of rows and columns. For example, memory cell block NC1 can include a set of normal memory cells designated by the reference NMC1, which can be implemented as a set of rows of memory cells. And cell block NC1 could include a set of spare memory cells designated by the reference SMC1, which can be disposed as a row of spare memory cells. The spare memory cell row SMC1 could replace a row of defective normal memory cells included in the set of normal memory cells NMC1 in memory cell block NC1. Similarly, cell blocks NC2 through NCn include normal cell blocks NMC2 through NMCn and spare cells SMC2 though SMCn. For multi-row address testing, a specific address can be associated with each row of memory cells.

Each of the cell blocks NC1 through NCn also includes a plurality of word lines, including normal word lines (NWL) associated with the normal memory cells. In FIG. 3, as an example, normal word lines NWL1-NWLn are associated with different rows of memory cells in the set of normal memory cells NMC1 of memory cell block NC1.

The enablement of specific word lines can be based on outputs of the redundancy signal generator 310. The redundancy signal generator 310 outputs a redundancy signal RS indicating whether the memory cell blocks NC1 through NCn include defective cells and outputs address signals RW1 through RWn indicating repair word lines (RWL) corresponding to the defective cells, if any. That is, a repair word line is a word line associated with at least one defective cell. The redundancy signal decoder 320 decodes the redundancy signal RS and the address signals RW1 through RWn associated with the repair word lines, and outputs word line enable signals NWENA1 through NWENAn that selectively enable normal word lines, i.e., word lines that access normal cells that do not include defective cells.

In detail, the word line drivers NWE1 through NWEn do not enable the repair word line (e.g. RWL), but selectively enable the normal word lines NWL1 through NWLn in response to the word line enable signals NWENA1 through NWENAn. To adapt to the loss of a row of normal memory cells associated with the address of the repair word line RWL, the word line driver NWEn can enable a spare word line corresponding to a row of spare memory cells, such as spare word line SWL of spare memory cell SMCn. The spare word line SWL (and associated spare cells) can be treated as a normal word line, in place of the repair word line RWL.

The redundancy signal generator 310 may comprise a plurality of fuse boxes FB1 through FBn, and a fuse box redundancy signal arithmetic operator, e.g., a NOR gate 315. Each of the plurality of fuse boxes FB1 through FBn comprises a plurality of fuses (e.g., F1 . . . Fi) that are selectively disconnected based on information about addresses associated with defective cells. The plurality of fuse boxes FB1 through FBn also output corresponding address signals RW1 through RWn indicating the repair word lines (e.g. RWL) associated with the defective cells, if any. Thus, RW1 through RWn are generated based on information about locations of the disconnected fuses and fuse box redundancy signals FBRS1 through FBRSn, which indicate which of the memory cell blocks NC1 through NCn include defective cells, if any.

The fuse box redundancy signal arithmetic operator, here NOR gate 315, outputs the redundancy signal RS in response to the fuse box redundancy signals FBRS1 through FBRSn. The NOR gate 315 performs a NOR-operation on the fuse box redundancy signals FBRS1 through FBRSn, and outputs the redundancy signal RS indicating whether the memory cell blocks NC1 through NCn include defective cells.

The redundancy signal decoder 320 can comprise a plurality of decoders "D" including decoders 321 through 32n, each of these decoders corresponding to one of the memory cell blocks NC1 through NCn. The decoders 321 through 32n decode the redundancy signal RS and the address signals RW1 through RWn, associated with the repair word lines (e.g. RWL), and output the word line enable signals NWENA1 through NWENAn that selectively enable the word lines.

In response to the word line enable signals NWENA1 through NWENAn, the word line drivers NWE1 through NWEn selectively enable the normal word lines of their respective memory cells, excluding any repair word lines. In the example of FIG. 3, word line driver NWE1 selectively enables normal word lines NWL1 through NWLn, but not the repair word line RWL. Thus, normal word lines can be selectively enabled during multi-row address testing.

A multi-row address test method performed by the semiconductor memory device 300 of the current embodiment will now be described with reference to FIG. 3.

If the memory cell block NC1 corresponding to the first fuse box FB1 of the redundancy signal generator 310 includes one or more defective cells, then the first fuse box FB1 disconnects corresponding fuses based on information indicating the addresses of the defective cells.

The first fuse box FB1 outputs a logic high fuse box redundancy signal FBRS1. Each of the other fuse boxes FB2 through FBn of the redundancy signal generator 310 outputs logic low fuse box redundancy signals FBRS2 through FBRSn, since they do not include defective memory cells. The logic high fuse box redundancy signal FBRS1 indicates that the memory cell block NC1 corresponding to the fuse box FB1 includes one or more defective cells. Also, the logic low fuse box redundancy signals FBRS2 through FBRSn indicates that the memory cell blocks NC2 through NCn, corresponding to the fuse boxes FB2 through FBn, do not include defective cells.

The fuse boxes FB1 through FBn output the address signals RW1 through RWn, indicating the addresses of any of the repair word lines (e.g. RWL). The addresses of the repair word lines in the address signals RW1 through RWn are determined based on the locations of the disconnected fuses, which indicate corresponding defective cells.

The NOR gate 315 performs the NOR-operation on the logic high fuse box redundancy signal FBRS1 and the logic low fuse box redundancy signals FBRS2 through FBRSn, and outputs the logic low redundancy signal RS. The logic low redundancy signal RS indicates that at least one of the memory cell blocks NC1 through NCn of the semiconductor memory device 300 includes at least one defective cell.

The decoders 321 through 32n of the redundancy signal decoder 320 operate in response to a multi-word line test enable signal MWLEN activated in a multi-word line test mode. The decoders 321 through 32n decode the redundancy signal RS and the address signals RW1 through RWn indicating the repair word lines, and output the word line enable signals NWENA1 through NWENAn that selectively enable the word lines in the set of normal memory cells NMC1 in cell block NC1.

The word line drivers NWE1 through NWEn do not enable the repair word lines (e.g. RWL), but selectively enable the normal word lines NWL1 through NWLn in response to the word lines enable signals NWENA1 through NWENAn.

If the semiconductor memory device 300 of the current embodiment does not include a defective cell, the fuse boxes FB1 through FBn output all the fuse box redundancy signals FBRS1 through FBRSn as logic low.

The NOR gate 315 performs the NOR-operation on the logic low fuse box redundancy signals FBRS1 through FBRSn, and outputs the logic high redundancy signal RS. The logic high redundancy signal RS indicates that the memory cell blocks NC1 through NCn of the semiconductor memory device 300 do not include any defective cells. The decoders 321 through 32n of the redundancy signal decoder 320 output the word line enable signals NWENA1 through NWENAn that enable all the word lines regardless of the state of the address signals RW1 through RWn in response to the logic high redundancy signal RS.

The word line drivers NWE1 through NWEn enable all the word lines of their respective memory cell blocks, but not the repair word lines, if any, in response to the word lines enable signals NWENA1 through NWENAn. To adapt to the loss of a row of normal memory cells associated with the address of the repair word line RWL, the word line driver NWEn can enable a spare word line corresponding to a row of spare memory cells, such as spare word line SWL of spare memory cell SMCn. The spare word line SWL can be treated as a normal word line, in place of the repair word line RWL.

According to the present invention, a multi-row address test method enables a plurality of word lines of a semiconductor memory device comprising a plurality of memory cell blocks, each memory cell block comprising a plurality of normal memory cells and at least one spare cell that replaces a defective cell included in the plurality of memory cell blocks.

The multi-row address test method comprises outputting a redundancy signal indicating whether a cell is defective, outputting address signals of a repair word line corresponding to the defective cell, and decoding the redundancy signal and the address signals of the repair word lines, and outputting word line enable signals that selectively enable normal word lines that do not relate to the defective cells.

The multi-row address test method has a similar operating principle to that of the semiconductor memory device, as described above. Therefore, since those of ordinary skill in the art will understand the multi-row address test method as described above, a further detailed description of the multi-row address test method is omitted. The semiconductor memory device and the multi-row address test method can reduce the time it takes to perform the multi-row address test.

While the present disclosure emphasizes multi-row addressing devices and methods, those skilled in the art will appreciate that the present invention could be applied to columns of memory cells. Thus, for the purposes of this disclosure the distinction between rows and columns is merely one of orientation, not one of substantive difference. In that sense, the terms rows and columns are substantially equivalent.

While the present invention has been particularly shown and described with reference to exemplary embodiments thereof, it will be understood by those of ordinary skill in the art that various changes in form and details may be made therein without departing from the spirit and scope of the present invention as defined by the following claims. The preferred embodiments should be considered in a descriptive sense only and not for purposes of limitation. Therefore, the scope of the invention is defined not by the detailed description of the invention, but by the appended claims, and all differences and equivalents within the scope of the claims will be construed as being included therein.

What is claimed is:

1. A semiconductor memory device comprising a plurality of memory cell blocks, each comprising a plurality of memory cells and a set of word lines configured to access cells from the plurality of memory cells, the semiconductor memory device comprising:
   a redundancy signal generator configured to output a redundancy signal indicating whether any of the plurality of memory cell blocks includes one or more defective cells and, if there are one or more defective cells in at least one cell block, configured to output address signals of repair word lines corresponding to the one or more defective cells;
   a redundancy signal decoder configured to decode the redundancy signal and the address signals of the repair word lines and based thereon to output word line enable signals associated with normal word lines that do not relate to the one or more defective cells; and
   a set of normal word line drivers configured to selectively enable the normal word lines and not to enable the repair word lines in response to the word line enable signals.

2. The semiconductor memory device of claim 1, wherein the redundancy signal generator comprises a plurality of fuse boxes, each fuse box including a plurality of fuses selectively disconnected based on information about addresses of the one or more defective cells, wherein the plurality of fuse boxes output the address signals of the repair word lines.

3. The semiconductor memory device of claim 2, wherein the plurality of fuse boxes are further configured to output fuse box redundancy signals indicating which of the memory cell blocks includes at least one defective cell from the one or more defective cells, wherein the redundancy signal generator further comprises a fuse box redundancy signal arithmetic operator configured to output the redundancy signal based on to the fuse box redundancy signals.

4. The semiconductor memory device of claim 3, wherein the fuse box redundancy signal arithmetic operator is a NOR gate that performs a NOR operation on the fuse box redundancy signals.

5. The semiconductor memory device of claim 1, wherein the redundancy signal decoder comprises a plurality of decoders corresponding to the plurality of memory cell blocks, wherein each decoder in the plurality of decoders is configured to decode the redundancy signal and the address signals of the repair word lines associated with a corresponding memory cell block from the plurality of memory cell blocks.

6. The semiconductor memory device of claim 1, wherein the redundancy signal decoder is configured to output the word line enable signals in response to a multi-word line test enable signal activated in a multi-word line test mode.

7. The semiconductor memory device of claim 1, wherein the plurality of memory cells further includes a set of spare memory cells configured to replace defective memory cells, and the set of word line drivers is configured to enable a word line from the set of word lines as a spare word line associated with at least one spare memory cell from the set of spare memory cells to replace at least one defective cell from the one or more defective cells.

8. A multi-row address test method that enables a plurality of word lines of a semiconductor memory device, the semiconductor memory device comprising a plurality of memory cell blocks, each comprising a plurality of memory cells and a set of word lines configured to access cells from the plurality of memory cells, the method comprising:
outputting a redundancy signal indicating whether at least one of the memory cell blocks includes one or more defective cells;
outputting address signals of repair word lines corresponding to the one or more defective cells;
decoding the redundancy signal and the address signals of the repair word lines and outputting word line enable signals corresponding to normal word lines and that do not relate to the one or more defective cells; and
selectively enabling the normal word lines, without enabling the repair word lines, in response to the word line enable signals.

9. The method of claim 8, wherein outputting the redundancy signal comprises selectively disconnecting one or more fuses in one or more of a plurality of fuse boxes based on information about addresses of the one or more defective cells, and outputting the address signals of the repair word lines.

10. The method of claim 9, wherein the method includes:
outputting fuse box redundancy signals by the plurality of fuse boxes indicating which of the memory cell blocks includes at least one defective cell from the one or more defective cells; and
outputting the redundancy signal by a fuse box redundancy signal arithmetic operator based on the fuse box redundancy signals.

11. The method of claim 10, wherein outputting the redundancy signal includes providing a NOR gate as the fuse box redundancy signal arithmetic operator and performing a NOR operation on the fuse box redundancy signals.

12. The method of claim 8, wherein the decoding includes:
providing a plurality of decoders corresponding to the plurality of memory cell blocks, and
decoding, with at least one decoder in the plurality of decoders, the redundancy signal and the address signals of the repair word lines associated with a corresponding memory cell block from the plurality of memory cell blocks.

13. The method of claim 8, including outputting the word line enable signals in response to a multi-word line test enable signal activated in a multi-word line test mode.

14. The method of claim 8, the method further comprising:
providing a set of spare memory cells configured to replace defective memory cells, and
enabling a word line from the set of word lines as a spare word line associated with at least one spare memory cell from the set of spare memory cells to replace at least one defective cell from the one or more defective cells.

15. A semiconductor memory device comprising a plurality of memory cell blocks each comprising a plurality of memory cells and a set of word lines configured to access cells from the plurality of memory cells, the semiconductor memory device comprising:
a redundancy signal generator configured to output a redundancy signal indicating whether any of the plurality of memory cell blocks includes one or more defective cells and, if there are one or more defective cells in at least one cell block, configured to output address signals of repair word lines corresponding to the one or more defective cells;
a redundancy signal decoder configured to decode the redundancy signal and the address signals of the repair word lines and based thereon to output word line enable signals associated with normal word lines that do not relate to the one or more defective cells; and
a set of normal word line drivers configured to selectively enable the normal word lines and not to enable the repair word lines in response to the word line enable signals,
wherein the plurality of memory cells further includes a set of spare memory cells configured to replace defective memory cells, and wherein the set of word line drivers is configured to enable a word line from the set of word lines as a spare word line associated with at least one spare memory cell from the set of spare memory cells to replace at least one defective cell from the one or more defective cells.

16. The semiconductor memory device of claim 15, wherein the redundancy signal generator comprises a plurality of fuse boxes, each fuse box including a plurality of fuses selectively disconnected based on information about addresses of the one or more defective cells, wherein the plurality of fuse boxes output the address signals of the repair word lines.

* * * * *